United States Patent
O'Grady et al.

(10) Patent No.: US 9,293,184 B2
(45) Date of Patent: Mar. 22, 2016

(54) METHOD OF PINNING DOMAIN WALLS IN A NANOWIRE MAGNETIC MEMORY DEVICE

(71) Applicant: University of York, York (GB)

(72) Inventors: Kevin O'Grady, Stamford Bridge (GB); Gonzalo Vallejo Fernandez, York (GB); Atsufumi Hirohata, York (GB)

(73) Assignee: University of York, York (GB)

( * ) Notice: Subject to any disclaimer, the term of this patent is extended or adjusted under 35 U.S.C. 154(b) by 0 days.

(21) Appl. No.: 14/350,434

(22) PCT Filed: Oct. 8, 2012

(86) PCT No.: PCT/GB2012/052493
§ 371 (c)(1),
(2) Date: Apr. 8, 2014

(87) PCT Pub. No.: WO2013/054098
PCT Pub. Date: Apr. 18, 2013

(65) Prior Publication Data
US 2014/0355337 A1  Dec. 4, 2014

(30) Foreign Application Priority Data

Oct. 10, 2011  (GB) .................................. 1117446.3

(51) Int. Cl.
*G11C 19/00* (2006.01)
*G11C 19/02* (2006.01)
(Continued)

(52) U.S. Cl.
CPC ............ *G11C 11/1675* (2013.01); *G11C 11/14* (2013.01); *G11C 11/161* (2013.01);
(Continued)

(58) Field of Classification Search
CPC ...... G11C 19/0808; G11C 19/02; G11C 5/02; G11C 11/1675; G11C 19/085; G11C 19/0875; G11C 19/0833; G11C 14/0081
USPC ...................................... 365/158, 78, 80, 172
See application file for complete search history.

(56) References Cited

U.S. PATENT DOCUMENTS 4,103,315 A * 7/1978 Hempstead ............ B82Y 25/00
                                                      257/E43.004
5,936,293 A * 8/1999 Parkin .......................... 257/422
(Continued)

FOREIGN PATENT DOCUMENTS

EP    0 962 939 A1   12/1999
GB    2 449 094 A    11/2008
(Continued)

OTHER PUBLICATIONS

English-language abstract of Japanese Patent No. 2007-324269 A, Dec. 13, 2007.
(Continued)

*Primary Examiner* — Ly D Pham
(74) *Attorney, Agent, or Firm* — DASCENZO Intellectual Property Law, P.C.

(57) ABSTRACT

There is provided a method of pinning domain walls in a magnetic memory device (10) comprising using an antiferromagnetic material to create domain wall pinning sites. Junctions (22) where arrays of ferromagnetic nanowires (16) and antiferromagnetic nanowires (20) cross exhibit a permanent exchange bias interaction between the ferromagnetic material and the antiferromagnetic material which creates domain wall pinning sites. The exchange bias field is between 30 to 3600 Oe and the anisotropy direction of the ferromagnetic elements is between 15 to 75° to an anisotropy direction of the antiferromagnetic elements.

17 Claims, 1 Drawing Sheet

Figure 1:
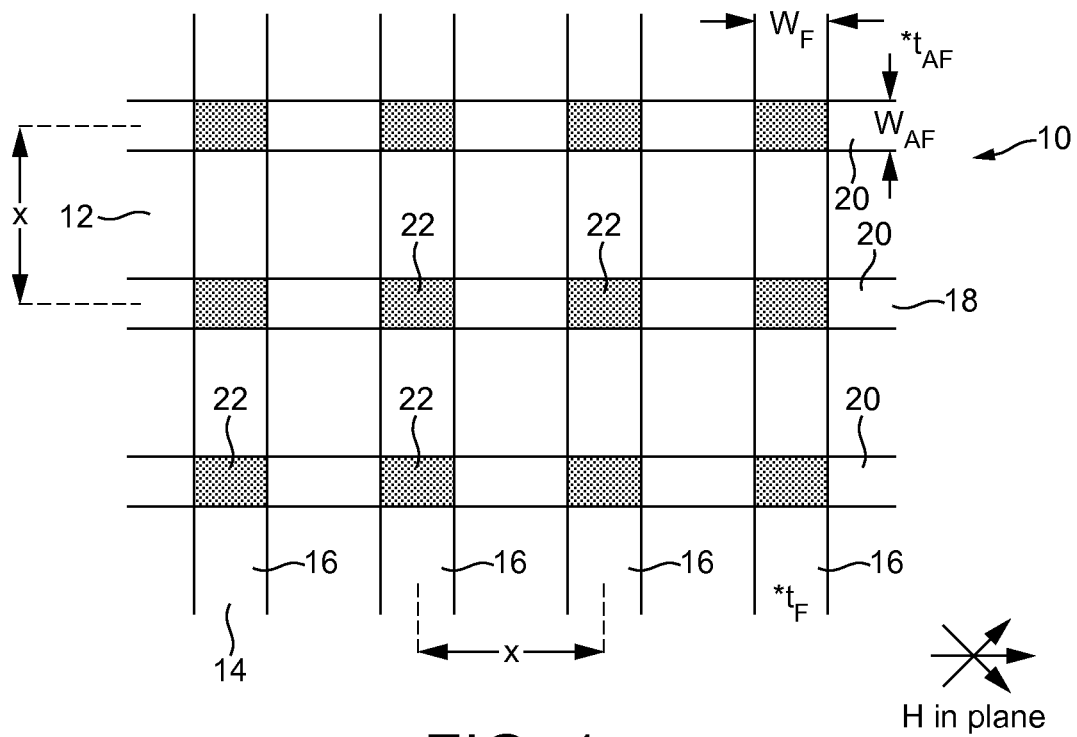

(51) Int. Cl.

| | | |
|---|---|---|
| *G11C 7/00* | (2006.01) | |
| *G11C 11/00* | (2006.01) | |
| *G11C 5/02* | (2006.01) | |
| *G11C 19/38* | (2006.01) | |
| *G11C 11/16* | (2006.01) | |
| *G11C 11/14* | (2006.01) | |
| *H04L 12/26* | (2006.01) | |
| *G11C 19/08* | (2006.01) | |
| *G11C 14/00* | (2006.01) | |

(52) U.S. Cl.
CPC ............ *G11C19/0808* (2013.01); *H04L 43/02* (2013.01); *H04L 43/10* (2013.01); *G11C 14/0081* (2013.01); *G11C 19/02* (2013.01); *G11C 19/085* (2013.01); *G11C 19/0833* (2013.01); *G11C 19/0875* (2013.01)

(56) References Cited

U.S. PATENT DOCUMENTS

| | | | |
|---|---|---|---|
| 7,626,844 B1 | 12/2009 | Moriya et al. | |
| 7,710,769 B2 | 5/2010 | Cowburn et al. | |
| 8,154,957 B1* | 4/2012 | Katsnelson et al. | 369/13.01 |
| 2003/0117837 A1 | 6/2003 | Park et al. | |
| 2004/0251232 A1 | 12/2004 | Chen et al. | |
| 2008/0160641 A1 | 7/2008 | Min et al. | |
| 2008/0273375 A1 | 11/2008 | Dahmani et al. | |
| 2009/0109739 A1 | 4/2009 | Ranjan et al. | |
| 2009/0141541 A1 | 6/2009 | Covington | |
| 2010/0188890 A1* | 7/2010 | Fukami | B82Y 10/00 365/158 |
| 2010/0214826 A1* | 8/2010 | Fukami | B82Y 10/00 365/158 |
| 2010/0237449 A1* | 9/2010 | Fukami | G11C 11/16 257/421 |
| 2011/0069541 A1 | 3/2011 | Ono et al. | |
| 2011/0236704 A1* | 9/2011 | Barbier et al. | 428/469 |
| 2011/0267879 A1* | 11/2011 | Nagahara et al. | 365/171 |
| 2011/0292718 A1* | 12/2011 | Suzuki et al. | 365/158 |
| 2012/0278582 A1* | 11/2012 | Fukami et al. | 711/166 |
| 2013/0113058 A1* | 5/2013 | Fukami et al. | 257/421 |
| 2013/0208536 A1* | 8/2013 | Allenspach et al. | 365/158 |
| 2013/0285700 A1* | 10/2013 | Fukami | H01L 43/08 326/47 |

FOREIGN PATENT DOCUMENTS

| | | |
|---|---|---|
| JP | 2007-324269 A | 12/2007 |
| KR | 2010-0082445 A | 7/2010 |
| WO | WO 2005/064357 | 7/2005 |
| WO | WO 2009/020258 | 2/2009 |

OTHER PUBLICATIONS

English-language abstract of Korean Patent No. 2010-0082445 A, Jul. 19, 2010.
Aley et al., "Texture Effects in IrMn/CoFe Exchange Bias Systems," IEEE Transactions on Magnetics, vol. 44, No. 11, Nov. 2008, 2820-2823.
Boulle, O. et al., "Current-induced domain wall motion in nanoscale ferromagnetic elements," Materials Science and Engineering R: Reports, vol. 72, No. 9, Jun. 12, 2011, 159-187.
O'Grady et al, "A new paradigm for exchange bias in polycrystalline thin films," Journal of Magnetism and Magnetic Materials, 322 (2010), 883-899.
Parkin et al, "Magnetic Domain-Wall Racetrack Memory," Science, vol. 320, Apr. 11, 2008, 190-194.
Search Report issued in connection with United Kingdom Patent Application No. GB1117446.3, 1 page, United Kingdom Intellectual Property Office.
Search Report issued in connection with United Kingdom Patent Application No. GB1218010.5, 2 pages, United Kingdom Intellectual Property Office, Nov. 22, 2012.

\* cited by examiner

METHOD OF PINNING DOMAIN WALLS IN A NANOWIRE MAGNETIC MEMORY DEVICE

FIELD OF THE INVENTION

This invention relates to a method of pinning domain walls in a magnetic memory device and in particular a magnetic shift register using such a method.

BACKGROUND TO THE INVENTION

Magnetic memory devices described in US 2004/0251232 and U.S. Pat. No. 7,626,844 comprise magnetic shift registers in the form of nanowire racetrack memories which rely on propagation of magnetic domain walls to store data. The position of the domain walls is used to signify different data states and for magnetic shift registers it is important to be able to move the domain walls in a precise and reproducible manner. It is difficult to tell accurately how far a domain wall has moved and so the prior art discloses the use of pinning sites to allow the movement of the domain walls to be controlled and defined in response to current pulses. US 2004/0251232 discloses the use of notches in ferromagnetic nanowires to act as pinning sites for domain walls and U.S. Pat. No. 7,710,769 also discloses use of notches in nanowires to create such domain wall traps. However there are significant issues to be overcome with getting such pinning sites to work within these devices, see in particular, Stuart S. P. Parkin et al, Magnetic Domain-Wall Racetrack Memory, Science 320, 190 (2008) as movement of domain walls between the notches is not consistent. Further, racetrack memories with notched wires are time-consuming and expensive to make.

SUMMARY OF THE INVENTION

In accordance with one aspect of the present invention, there is provided a method of pinning domain walls in a magnetic memory device, such as a magnetic shift register, comprising creating an exchange bias interaction between a ferromagnetic material and an antiferromagnetic (AF) material to create permanent domain wall pinning sites. The exchange bias field $H_{ex}$ is preferably between 30 to 3600 Oe and more preferably between 50 to 150 Oe.

The method may comprise associating regions of AF material with regions of F material, such as are found on a magnetic shift register providing a racetrack memory, the associated regions providing junctions at which domain wall pinning takes place.

The exchange bias interaction may be created by heating the AF material whilst proximal the F material in an applied magnetic field. Preferably the applied magnetic field is of sufficient magnitude to saturate the F material and sets the anisotropy of the AF material at 45° to the anisotropy of the F material. As will be appreciated, different F materials require different magnitudes of applied magnetic field depending on their coercivity.

The AF material will generally be heated to around the Néel temperature of the AF material, subject to ensuring that the temperature is not so high that diffusion occurs between the AF and F materials. Thus for certain materials with a very high Néel temperature, a lower temperature will be selected and heating applied for a longer time. Preferably the method further comprises applying the magnetic field during cooling, usually for a period of time $t_{set}$, typically between one minute and two hours, so that the F material is under an applied field whilst cooling takes place from a temperature $T_{set}$.

The method may further comprise angularly offsetting a plurality of parallel elongate AF material elements with respect to a plurality of adjacent parallel elongate F material elements, with junctions occurring where the respective elements cross each other. This creates a first array of spaced-apart F elongate elements extending in a first direction crossed by a second array of spaced-apart AF elongate elements extending in a second direction. The junctions formed by the proximal F and AF elements act as domain wall pinning sites because of the shift of the hysteresis loop and/or the increased coercivity of the F material at the junction due to the magnetic interaction with the AF material. Thus a series of regularly spaced-apart parallel F nanowires can have positioned over or beneath them a series of parallel regularly spaced-apart elongate AF nanowires so as to create an array with domain wall pinning sites occurring where the AF wires overlay or underlay and contact the F wires. The angular offset between the first direction and the second direction may be between 135° and 45°.

In accordance with another aspect of the present invention, there is provided a magnetic memory device comprising a first array of spaced-apart F elongate elements extending in a first direction crossed by a second array of spaced-apart elongate elements extending in a second direction to create an array of junctions, wherein the elongate elements of the second array are antiferromagnetic and each junction has a permanent exchange bias.

The anisotropy direction of the ferromagnetic elements is preferably set to be between 15° to 75° and more preferably at 45° to an anisotropy direction of the antiferromagnetic elements. This can be done by altering the orientation of the first and second directions or the applied magnetic field.

Preferably the first direction and the second direction are rotated with respect to each other such that the two arrays are angularly offset and cross each other at a series of points or junctions. Each junction provides a domain wall pinning site, allowing the location of the domain wall pinning site to be known exactly.

The first direction and second direction are desirably offset from each other by an angle between 135° and 45°, and more preferably are offset by an angle of 90°.

The elongate elements in each array are preferably regularly spaced, and preferably the elongate elements in each array are parallel to the other elongate elements in that array.

Typically the device will be arranged such that the second array overlies the first array but if desired the second AF array can be created first with the first array then overlying the second array.

Preferably the AF material is one of IrMn, FeMn, PtMn, CoO coupled to Co, or NiO coupled to Ni or any other antiferromagnetic metallic alloys, or mixed metal antiferromagnetic oxides, for example CoNiO. More preferably the AF material is Iridium Manganese of a composition approximately $IrMn_3$, which is highly resistant to corrosion.

The AF elongate elements preferably have a width in the range 10 to 500 nm and more preferably 50 to 150 nm. Preferably the elongate elements in both the first array and the second array are spaced apart from adjacent elements in the same array by 50 nm to 500 nm.

Each junction desirably has an exchange bias field $H_{ex}$ of between 30 to 3600 Oe, more preferably 30 to 1000 Oe and more preferably 50 to 150 Oe.

Each junction may comprise a single layer of antiferromagnetic grains.

In accordance with another aspect of the invention, there is also provided a magnetic memory device comprising a plurality of junctions having a permanent exchange bias field of between 30 and 3600 Oe, more preferably 30 to 1000 Oe and more preferably 50 to 1150 Oe.

Figure 2:
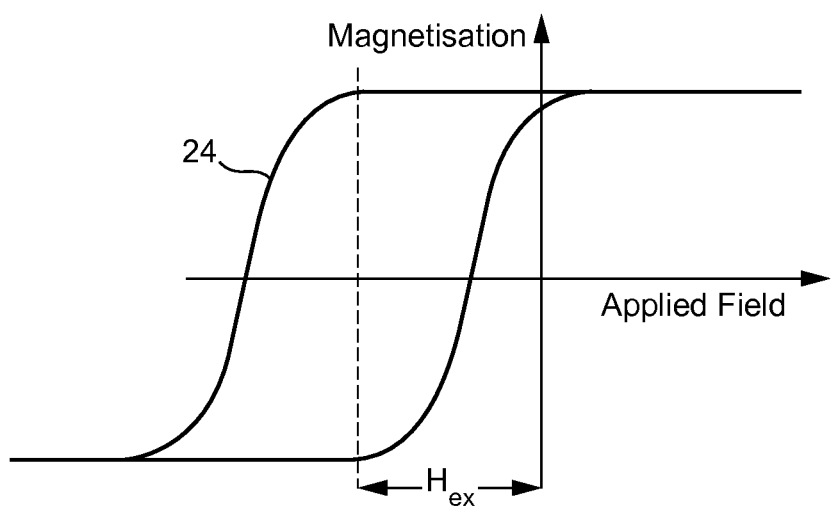

The invention will now be described, by way of example, and with reference to the accompanying drawings in which:

FIG. 1 is a schematic plan view of a magnetic memory device in accordance with the present invention; and FIG. 2 shows a diagram illustrating the shift in hysteresis loop exhibited at junctions within the magnetic memory device.

DESCRIPTION

FIG. 1 shows a magnetic memory device 10, or magnetic shift register, comprising a substrate 12 onto which an array 14 of parallel regularly spaced-apart elongate ferromagnetic (F) nanowires 16 or tracks have been created to carry data in the form of magnetic domains and their domain walls. The memory is a conventional racetrack memory with the F nanowires consisting of either CoFe or NiFe with the wires or tracks produced by lithography using standard lift-off technology such as is described in US 2004/0251232 or by other techniques known to those in the art.

In accordance with the invention, a second offset array 18 of parallel regularly spaced-apart nanowires 20 made of antiferromagnetic (AF) material is formed proximal to and crossing the first array 14, again by using a lithographic process or other known technique of forming such tracks on memory devices. Where the arrays 14, 18 cross, a plurality of junctions 22 are formed and at each junction 22 the AF material and F material interact magnetically such that the AF material causes a significant increase in the local anisotropy of the F material and this creates sites where the coercivity of the F material is increased. This region of increased coercivity acts to trap domain walls and so domain pinning takes place. To improve the ability of the array of junctions to act as domain wall pinning sites, the AF material is coupled to the F material by using exchange bias. This creates a significant increase in the anisotropy of the junctions and can be used to create a controllable or tuneable domain wall pin.

When creating the AF array 18, a seed layer of one of Ru, Cu, NiCr or alloys thereof is first deposited directly below where the AF material is to be positioned. The AF material is then sputtered onto the seed layer. For an AF material, and as described in Aley et al., "Texture Effects in IrMn/CoFe Exchange Bias Systems", IEEE Transactions on Magnetics, Vol. 44, No. 11, November 2008, 2820-2823, such seed layers are used to control the magnetic properties of materials by affecting their growth characteristics, for example grain size. Such seed layers do not interfere with the magnetic interaction between the F and AF.

The AF material is typically selected from IrMn, FeMn, PtMn, CoO coupled to Co, or NiO coupled to Ni. IrMn, typically $IrMn_3$, is particularly desired as it is corrosion resistant. For a suitable interaction to take place at the junctions between the AF and F materials, grain sizes in the AF wires are selected to have a diameter in the range 4 nm to 25 nm with small grain sizes making alignment of domains easier. The AF material has values of the antiferromagnetic anisotropy constant $K_{AF}$ such that the product $K_{AF}V$ where V is the volume of the AF grains gives rise to a system that is stable at the operating temperature of the memory device and can be set as described in O'Grady et al, "A New Paradigm For Exchange Bias In Polycrystalline Thin Films", Journal of Magnetism and Magnetic Materials, 322 (2010), 883-899. For optimum performance, the AF material layer has a narrow distribution of AF grain diameters with preferred standard deviations lying in the range 0.1 to 0.7 for a lognormal distribution function. The volume of the AF grains can be controlled by the thickness of the antiferromagnetic layer and the anisotropy constant which for the case of IrMn should lie in the range $1\times10^6$ to $1\times10^8$ ergs/cc. Typically at each junction 22, the AF material has in the region of 500-2000 grains.

The F array and AF array are offset from each other by an offset angle in the range 45° to 135°. In the example shown in FIG. 1, the offset angle is set at 90° such that the two sets of wires are orthogonal to each other.

For an offset angle of 90°, F nanowires 16 fabricated with a spacing of x and AF nanowires 20 fabricated with a spacing of x, necessarily give rise to an array of junctions 22 regularly spaced apart by x throughout the array, as shown in FIG. 1. Whilst regular spacing of junctions is illustrated, as will be appreciated by those skilled in the art, the spacing between the junctions can be altered depending on the chosen fabrication set up for the respective sets of nanowires. Thus if necessary, different spacings can be provided and for other offset angles, the spacing can be calculated using trigonometry. The spacing and positioning of the junctions where the domain wall pinning takes place is known and predictable given knowledge of the manufacturing parameters. The domain wall pinning sites are permanent and enduring and tied to the junctions 22, not offset from those junctions in an unpredictable way.

Throughout the array, F nanowires 16 typically have a substantially constant composition and physical structure and similarly AF nanowires 20 also have a substantially constant composition and physical structure.

The F wires 16 typically have a width in the range 100 to 500 nm, with a width around 300 nm preferred. The AF wires 20 typically have a reduced width in the range 50 to 200 nm and are generally selected to have a width of the order of 100 nm. Both the F and AF elements have a constant thickness, i.e. depth, of between 5 to 100 nm and preferably between 5 nm and 20 nm. Grains with a diameter 4 to 25 nm are columnar and for an AF wire of depth between 20 to 100 nm, a single layer of columnar grains exists across the junction 22. Where the AF material is IrMn, then a preferred width of wire 20 is 100 nm with a thickness of 30 nm. The elongate elements 16, 20 in each array 14, 18 are spaced apart from adjacent elements in the same array by 50 nm to 500 nm. Whilst a two-dimensional representation is shown in FIG. 1, a three-dimensional stacked array can be produced if required.

Where the AF tracks are deposited using sputtering, a residual field in the sputtering machine can induce a minor exchange bias field, although this is not reproducible or of consistent strength. To create a reproducible and consistent exchange bias interaction, the overlying arrays of F and AF nanowires are manufactured and then the exchange bias interaction between the F and AF materials at junctions 22 is created by heating and subsequently cooling the arrays in a large magnetic field. To do this, the magnetic memory device is heated to a temperature in the range 120° C. to a value above the Néel temperature of the AF, which for IrMn is 690K, whilst a magnetic field sufficient to saturate the F layer is applied in the plane of the flat wires. The device is then cooled under the applied field.

The field will typically lie in the range 300 Oe to 1 T but a significantly higher field of 5 T can be used to maximize the exchange bias. This process is known as setting the antiferromagnet and shifts the hysteresis loop 24 of the F at the junction by the exchange bias field $H_{ex}$ as shown in FIG. 2.

By heating whilst a magnetic field is applied, the grain size, the grain size distribution and the value of the coercivity and exchange bias interaction can be controlled to give an appropriate exchange bias interaction with typically $H_{ex}$ 30 to 3600

Oe and preferably 50 to 150 Oe at junctions 22. Typically a field of 1 T will be used to set the exchange bias interaction as this will align the bulk of the AF grains in the junction 22 both at a macro and an atomic level.

The magnitude of the magnetic field used in the field cooling and the physical structure of the AF, such as grain structure and thickness, can be used to tune the strength of the domain wall pin.

When applying the magnetic field, the anisotropy direction of the AF relative to the F needs to be set at 45° as the domain walls for the AF material lie at 45° to wire 20. Thus where the offset angle is 90° and the F array and AF array are orthogonal to each other, the field will be applied at 45° to each array, in the plane of the arrays which are effectively two-dimensional as they have minimal thickness. Where other offset angles are used, the field direction will be adjusted to ensure that the anisotropy of the AF grains is at 45° to the anisotropy of the F wires.

Whilst the heating temperature should be greater than the Néel temperature of the AF at which it changes magnetic phase to become paramagnetic, in many cases, and specifically in the case of IrMn and other alloys containing Mn, the Néel temperature is greater than the temperature at which the nanowire physical microstructure is damaged. Under these circumstances the AF material is aligned or 'set' by heating to a temperature as high as possible but below the Néel temperature and the system field cooled from this value after a time $T_{set}$ which is typically between 1 minute and 2 hours.

For example for the alloy IrMn$_3$ with a Néel temperature $(T_N)$=690K, field cooling from temperatures as low as 475K can result in the setting of IrMn layers. Thus to set the exchange bias interaction between the AF and F materials, heating of the device 10 takes place to the maximum desired temperature $(T_{set})$ which does not result in interfacial diffusion between the F and AF wires at the junctions while applying a magnetic field sufficient to saturate the F layer. For IrMn$_3$, typically heating can take place for 90 minutes as after this the change of the exchange bias field over time is very small and thus by choosing 90 minutes, the reproducibility of the value of the exchange bias field $H_{ex}$ in different devices is consistent.

After setting the AF material, the AF wire 20 is composed in such a manner as to render the grains in the AF wire or film thermally stable with the vast majority of the grains aligned in the field direction.

At junctions 22 where AF and F materials interact magnetically, the hysteresis loop of the F material is shifted due to the exchange bias interaction with the AF material, see FIG. 2, such that a very high switching field is needed for domain walls to move past the permanently exchange biased junction 22. The anisotropy of the remainder of the F nanowire is unaffected and the domain walls are able to propagate freely between the junctions 22. In operation, the domain walls move along the F nanowires 16 until they encounter a junction 22 and only pass beyond junction 22 once they receive a spin polarised current pulse which provides enough energy to allow them to leave the pinning site 22 without heating taking place. A current pulse causing heating could not be used as it would destroy the exchange bias interaction at the junctions and so destroy the pinning effect at junctions 22. The controllable domain wall pin results from the fact that the AF material is granular reversing by coherent rotation as opposed to the situation in a F crossing wire where the reversal is by domain wall motion. Reversal by coherent rotation produces a more controllable effective switching field than a domain wall process.

The strength of the domain wall pinning effect will be determined by the fraction of the antiferromagnetic grains that are set and thermally stable at the operating temperature. Ideally 100% of the grains will meet this requirement but a smaller fraction of even 30% by volume will produce the effect. Thereafter the pinning strength will be determined by the resulting increase in the nucleation field in the ferromagnetic layer often characterized by the shift in the loop $H_{ex}$ shown in FIG. 2.

The strength of the pinning is determined by the value of $H_{ex}$ and the width of the antiferromagnetic wire. The strength of the pin can be adapted by controlling the exchange bias through variation of the thickness of the F wire and the width of the AF wire.

The junctions 22 with a permanent non-fluctuating exchange bias interaction act as regularly spaced-apart domain wall pinning sites, the locations of which are known. Their position is well defined and quantifiable and overlying sets of wires can be produced straightforwardly by lithography. This technique using a permanent exchange bias interaction provides a much cheaper way of producing domain wall pinning sites than the prior art techniques of using notches in nanowires which are expensive to manufacture and also do not reliably indicate the exact position of domain wall pinning sites as the interaction of the domain walls with the notches depends on various factors, not just the positioning of the notches. By having junctions using the exchange bias interaction between AF and F materials, sites with a known position and a reproducible pinning effect can be provided which allows for controllable data transfer in the memory device.

The invention claimed is:

1. A method of pinning moveable domain walls in a magnetic shift register device comprising creating a permanent exchange bias interaction between a ferromagnetic material and an antiferromagnetic material to create domain wall pinning sites, wherein the exchange bias interaction is created by heating the antiferromagnetic material whilst proximal the ferromagnetic material in an applied magnetic field, and wherein the applied magnetic field sets an anisotropy direction of the antiferromagnetic material at 45° to an anisotropy direction of the ferromagnetic material.

2. A method of pinning domain walls according to claim 1, wherein there is an exchange bias field of between 30 to 3600 Oe.

3. A method of pinning domain walls according to claim 1 comprising associating regions of antiferromagnetic material with regions of a ferromagnetic material.

4. A method of pinning domain walls according to claim 1, wherein the method further comprises applying the applied magnetic field whilst cooling takes place.

5. A method of pinning domain walls according to claim 1, wherein the method further comprises angularly offsetting a plurality of parallel elongate antiferromagnetic material elements with respect to a plurality of adjacent parallel elongate ferromagnetic material elements, with junctions occurring where the respective elements cross each other.

6. A magnetic shift register device comprising a first array of spaced-apart ferromagnetic elongate elements extending in a first direction crossed by a second array of spaced-apart elongate elements extending in a second direction to create an array of junctions, wherein the elongate elements of the second array are antiferromagnetic and each junction has a permanent exchange bias field, wherein an anisotropy direction of the ferromagnetic elements is set to be 45° to an anisotropy direction of the antiferromagnetic elements.

7. A magnetic shift register device according to claim 6, wherein the first direction and the second direction are rotated with respect to each other such that the two arrays are angularly offset.

8. A magnetic shift register device according to claim 7, wherein the first direction and second direction are offset from each other by an angle between 135° and 45°.

9. A magnetic shift register device according to claim 8, wherein the first direction and second direction are offset from each other by an angle of 90°.

10. A magnetic shift register device according to claim 6, wherein the elongate elements in each array are regularly spaced and are parallel to the other elongate elements in that array.

11. A magnetic shift register device according to claim 6, wherein the antiferromagnetic material is one of IrMn, FeMn, PtMn, CoO coupled to Co, NiO coupled to Ni, any antiferromagnetic metallic alloy, or CoNiO.

12. A magnetic shift register device according to claim 6, wherein the antiferromagnetic elongate elements have a width in the range 10 to 500 nm.

13. A magnetic shift register device according to claim 6, wherein the antiferromagnetic elongate elements have a depth in the range 20 to 100 nm.

14. A magnetic shift register device according to claim 6, wherein each junction has an exchange bias field of between 50 and 3600 Oe.

15. A magnetic shift register device according to claim 6, wherein each junction comprises a single layer of antiferromagnetic grains.

16. A magnetic shift register device comprising a first array of spaced-apart ferromagnetic elongate elements extending in a first direction crossed by a second array of spaced-apart elongate elements extending in a second direction to create an array of junctions, wherein the elongate elements of the second array are antiferromagnetic and each junction has a permanent exchange bias field, wherein the first direction and the second direction are rotated with respect to each other such that the two arrays are angularly offset, and wherein the first direction and second direction are offset from each other by an angle between 135° and 45°.

17. A magnetic shift register device according to claim 16, wherein the first direction and second direction are offset from each other by an angle of 90°.

* * * * *